(12) United States Patent
Senga et al.

(10) Patent No.: US 11,890,964 B2
(45) Date of Patent: Feb. 6, 2024

(54) VEHICLE AND CONTROL DEVICE

(71) Applicant: PANASONIC INTELLECTUAL PROPERTY MANAGEMENT CO., LTD., Osaka (JP)

(72) Inventors: Hisashi Senga, Kanagawa (JP); Masaya Nishinaka, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 33 days.

(21) Appl. No.: 17/886,091

(22) Filed: Aug. 11, 2022

(65) Prior Publication Data

US 2023/0082907 A1 Mar. 16, 2023

(30) Foreign Application Priority Data

Sep. 15, 2021 (JP) ................................. 2021-150567

(51) Int. Cl.
*B60L 50/60* (2019.01)
*H02J 7/00* (2006.01)
(Continued)

(52) U.S. Cl.
CPC ............ *B60L 58/18* (2019.02); *B60L 3/0046* (2013.01); *B60L 50/60* (2019.02); *G01R 31/3835* (2019.01); *H01M 10/425* (2013.01); *H01M 10/48* (2013.01); *H01M 50/202* (2021.01); *H01M 50/249* (2021.01); *H01M 50/284* (2021.01); *H01M 50/296* (2021.01);
(Continued)

(58) Field of Classification Search
CPC ............................ B60L 50/60; H02J 7/00714

USPC ......................................................... 307/10.1
See application file for complete search history.

(56) References Cited

U.S. PATENT DOCUMENTS 5,057,702 A    10/1991  Kitagawa et al.
5,825,146 A    10/1998  Agata et al.
2007/0223164 A1  9/2007  Oki et al.

FOREIGN PATENT DOCUMENTS

EP    3 382 895 A1    10/2018
GB    2090704 A        7/1982
(Continued)

OTHER PUBLICATIONS

Office Action issued in Japanese Patent Application No. 2021-150567, dated Mar. 22, 2023, together with an English translation.

*Primary Examiner* — Daniel Kessie
*Assistant Examiner* — Dru M Parries
(74) *Attorney, Agent, or Firm* — GREENBLUM & BERNSTEIN, P.L.C.

(57) ABSTRACT

A vehicle includes first and second power supply cords. Positive and negative electrodes of a battery are connected to a first power supply portion and a first ground portion of a first circuit, respectively, by the first power supply cord, and connected to a second power supply portion and a second ground portion of the second circuit, respectively, by the second power supply cord. The first circuit includes a control circuit configured to measure voltages of the second power supply portion as a first voltage and as a second voltage with reference to a potential of the first ground portion and a potential of the second ground portion, respectively. In a case in which the first and second voltages have a predetermined relationship, power supplied from the second power supply cord to the second circuit is set to be a predetermined value or less.

20 Claims, 6 Drawing Sheets

(51) Int. Cl.
  *B60L 58/18* (2019.01)
  *B60L 3/00* (2019.01)
  *H01M 50/202* (2021.01)
  *H01M 50/249* (2021.01)
  *H01M 50/284* (2021.01)
  *H01M 50/296* (2021.01)
  *H01M 10/42* (2006.01)
  *H01M 10/48* (2006.01)
  *H01M 50/298* (2021.01)
  *H01M 50/583* (2021.01)
  *G01R 31/3835* (2019.01)
  *H05K 7/14* (2006.01)

(52) U.S. Cl.
  CPC ....... *H01M 50/298* (2021.01); *H01M 50/583* (2021.01); *H02J 7/0063* (2013.01); *H02J 7/00714* (2020.01); *H01M 2220/20* (2013.01); *H02J 2207/20* (2020.01); *H05K 7/1427* (2013.01)

(56) References Cited

FOREIGN PATENT DOCUMENTS

| | | |
|---|---|---|
| JP | S57-080945 A | 5/1982 |
| JP | H02-262714 A | 10/1990 |
| JP | H09-322559 A | 12/1997 |
| JP | 2004-328669 A | 11/2004 |
| JP | 2009-021289 A | 1/2009 |
| JP | 2012-109659 A | 6/2012 |
| JP | 2015-053604 A | 3/2015 |
| WO | 2005/109589 A1 | 11/2005 |
| WO | 2017/090352 A1 | 6/2017 |

VEHICLE AND CONTROL DEVICE

TECHNICAL FIELD

The present disclosure relates to a vehicle such as an automobile and a control device that controls a suspension, a steering wheel, a brake, an engine, and the like in the vehicle.

BACKGROUND ART

As a technique for preventing a failure caused by breakage of a ground line common to a plurality of electronic components constituting an electronic device, for example, a technique described in WO-A1-2017/090352 is known.

SUMMARY OF INVENTION

The present disclosure provides a vehicle provided with at least a first wheel and a second wheel so as to be movable by rotating the first wheel and the second wheel, the vehicle including: a battery; a first circuit; a second circuit; a housing in which the first circuit and the second circuit are stored; a first power supply cord connecting at least a positive electrode and a negative electrode of the battery to a first power supply portion and a first ground portion of the first circuit, respectively; and a second power supply cord connecting at least the positive electrode and the negative electrode of the battery to a second power supply portion and a second ground portion of the second circuit, respectively, wherein a second consumption current of the second circuit is possible to be larger than a first consumption current of the first circuit, wherein the first circuit includes a control circuit, wherein the control circuit is configured to measure a voltage of the second power supply portion of the second circuit as a first voltage with reference to a potential of the first ground portion, wherein the control circuit is configured to measure a voltage of the second power supply portion of the second circuit as a second voltage with reference to a potential of the second ground portion, and wherein in a case in which the first voltage and the second voltage have a predetermined relationship, power supplied from the second power supply cord to the second circuit is set to be a predetermined value or less.

The present disclosure provides a control device mountable on a vehicle, the vehicle being provided with at least a first wheel and a second wheel so as to be movable by rotating the first wheel and the second wheel, the vehicle including a battery, a first power supply cord connected to a positive electrode and a negative electrode of the battery, and a second power supply cord connected to the positive electrode and the negative electrode of the battery, the control device including: a first circuit; a second circuit; and a housing in which the first circuit and the second circuit are stored, wherein the first power supply cord is set to connect at least the positive electrode and the negative electrode of the battery to a first power supply portion and a first ground portion of the first circuit, respectively, wherein the second power supply cord is set to connect at least the positive electrode and the negative electrode of the battery to a second power supply portion and a second ground portion of the second circuit, respectively, wherein a second consumption current of the second circuit is possible to be larger than a first consumption current of the first circuit, wherein the first circuit includes a control circuit, wherein the control circuit is configured to measure a voltage of the second power supply portion of the second circuit as a first voltage with reference to a potential of the first ground portion, wherein the control circuit is configured to measure a voltage of the second power supply portion of the second circuit as a second voltage with reference to a potential of the second ground portion, and wherein in a case in which the first voltage and the second voltage have a predetermined relationship, power supplied from the second power supply cord to the second circuit is set to be a predetermined value or less.

DESCRIPTION OF EMBODIMENTS

Hereinafter, an embodiment (hereinafter, referred to as "the present embodiment") that specifically discloses a vehicle and a control device according to the present disclosure will be described in detail with reference to the drawings as appropriate. An unnecessarily detailed description may be omitted. For example, detailed description of a well-known matter or repeated description of substantially the same configuration may be omitted. This is to avoid unnecessary redundancy in the following description and to facilitate understanding of those skilled in the art. It should be noted that the accompanying drawings and the following description are provided for a thorough understanding of the present disclosure by those skilled in the art, and are not intended to limit the subject matter recited in the claims.

Hereinafter, embodiments of the present disclosure will be described in detail with reference to the drawings.

Introduction to Embodiments

In some cases, a control device includes a circuit divided into a controller system and a power system. Further, a ground of a power supply may be divided between the controller system and the power system.

Figure 7:
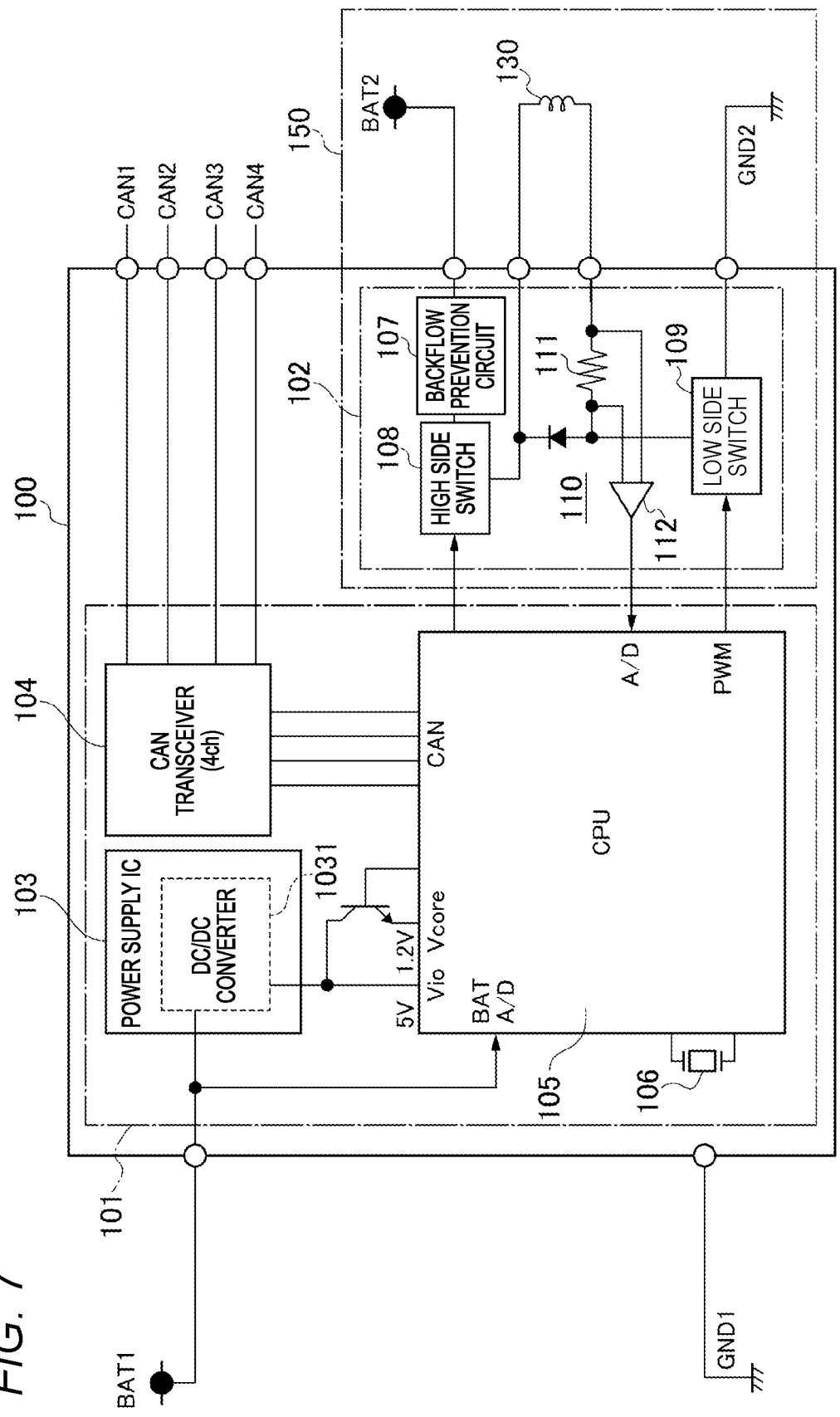
FIG. 7 is a circuit diagram showing a configuration of a control device that controls a suspension of a four-wheel vehicle.

FIG. 7 is a circuit diagram showing a configuration of a control device 100 that controls a suspension of a four-wheel vehicle. In the control device 100 shown in FIG. 7, a circuit is divided into a controller system and a power system, and a ground of a power supply is divided between the controller system and the power system. The control device 100 is a so-called electronic control unit (ECU).

In FIG. 7, GND1 is a ground of a first circuit 101 of the controller system (hereinafter, referred to as a "first ground portion"), and GND2 is a ground of a second circuit 102 of the power system (hereinafter, referred to as a "second ground portion"). On the other hand, BAT1 is a power supply of the first circuit 101 of the controller system (hereinafter, referred to as a "first power supply portion"), and BAT2 is a power supply of the second circuit 102 of the power system (hereinafter, referred to as a "second power supply portion"). The first power supply portion BAT1 and the second power supply portion BAT2 are connected to a positive electrode of a battery (not shown). The first ground portion GND1 and the second ground portion GND2 are connected to a negative electrode of the battery (not shown).

The first circuit 101 of the controller system includes a power supply IC 103, a controller area network (CAN) transceiver 104, a central processing unit (CPU) 105, and the like. The second circuit 102 of the power system includes a backflow prevention circuit 107, a high side switch 108, a low side switch 109, a load current detection circuit 110, and the like.

In the first circuit 101 of the controller system, the power supply IC 103 includes a DC/DC converter 1031 that converts a voltage of the first power supply portion BAT 1 into a voltage to be used by the CPU 105. The CAN transceiver 104 communicates with other control devices and a central gateway which are not shown.

The CPU 105 operates on a voltage output from the power supply IC 103, and controls the high side switch 108 and the low side switch 109 based on road surface information acquired by the CAN transceiver 104 and a current flowing through a solenoid load 130 connected to the second circuit 102 of the power system. In this case, pulse width modulation (PWM) control is performed on the low side switch 109. A Schottky barrier diode has a function of circulating a current flowing through the solenoid load 130 when the low side switch 109 is switched from on to off. A basic clock for operating the CPU 105 is obtained by a crystal oscillator 106.

In the second circuit 102 of the power system, the high side switch 108 is connected between the second power supply portion BAT2 and the solenoid load 130, and the low side switch 109 is connected between the second ground portion GND2 and the solenoid load 130. A current flowing through the solenoid load 130 is detected by the load current detection circuit 110 including a resistor 111 and an OP amplifier (operational amplifier) 112. The resistor 111 is inserted in series with the solenoid load 130. The OP amplifier 112 amplifies a voltage generated in the resistor 111 and outputs the amplified voltage to an analog to digital (A/D) terminal of the CPU 105. CPU 105 has an A/D conversion function and digitally converts an analog voltage output from the OP amplifier 112. The second circuit 102 of the power system, the solenoid load 130, the second power supply portion BAT2, and the second ground portion GND2 constitute an electronically controlled suspension 150. Although not shown, the solenoid load, the low side switch, the Schottky barrier diode, the resistor, and the OP amplifier correspond to four wheels.

The control device 100 controls a damping force of a solenoid damper (not shown) according to the magnitude of undulation of a road surface, so as to provide comfortable ride with less vertical movement.

In the control device 100 in which the ground is divided between the first circuit 101 of the controller system and the second circuit 102 of the power system as described above, when an electric wire connected to the first ground portion GND1 of the first circuit 101 of the controller system breaks, a ground potential of the first circuit 101 of the controller system increases (for example, increases to 1.8 V as shown in FIG. 7), and even if the CPU 105 outputs Lo logic from the PWM terminal, the low side switch 109 is recognized as Hi and is always turned on. In this case, a high current continues to flow to the solenoid load 130, which leads to deterioration of the solenoid load 130 and battery exhaustion.

Therefore, the following embodiments will describe a vehicle and a control device capable of preventing a failure caused by disconnection of a ground of a circuit of a controller system in a case where the ground is divided between the circuit of the controller system and a circuit of a power system.

Figure 1:
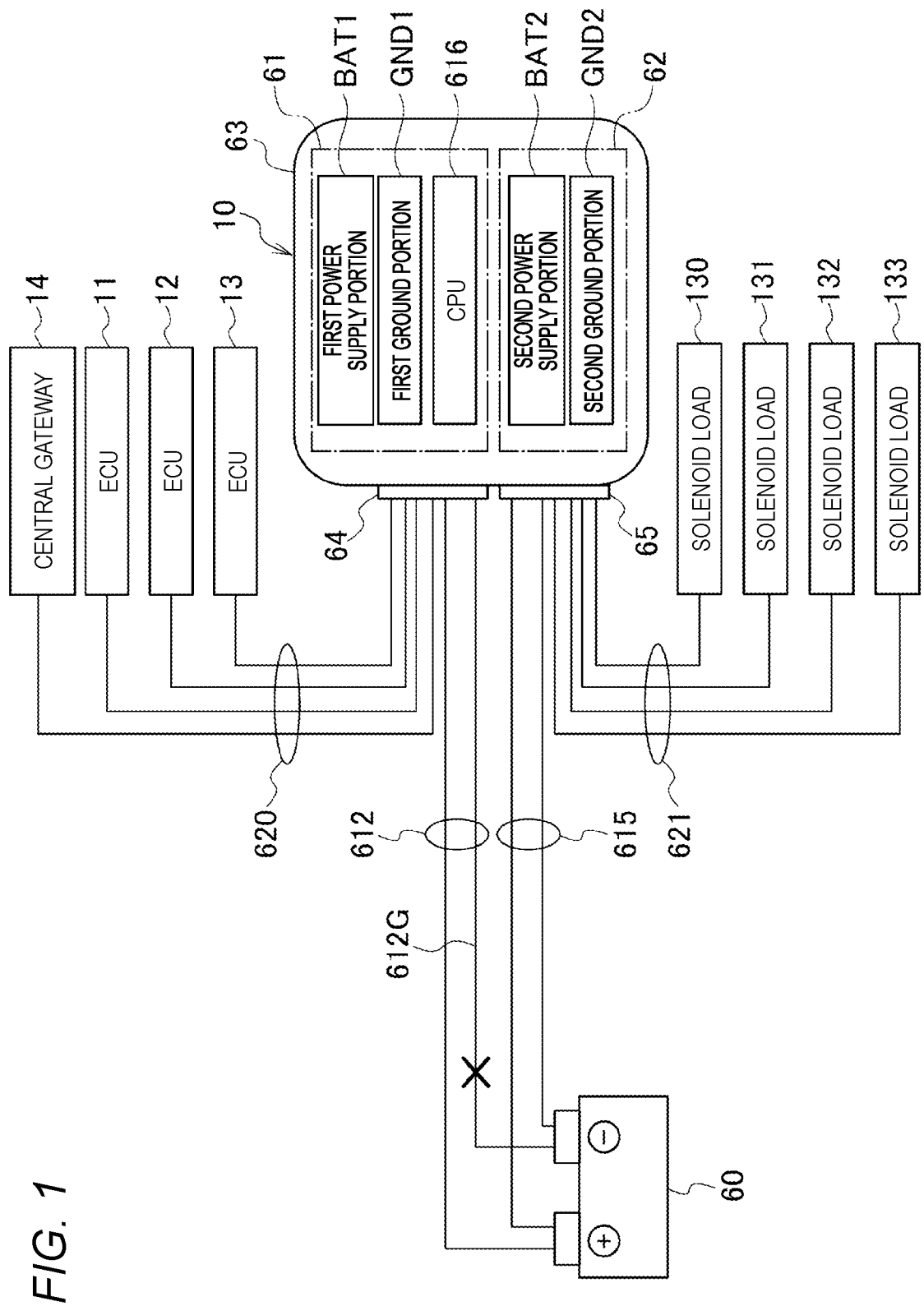
FIG. 1 is a block diagram showing a schematic configuration of a control device according to an embodiment and various peripheral devices connected to the control device.
Figure 2:
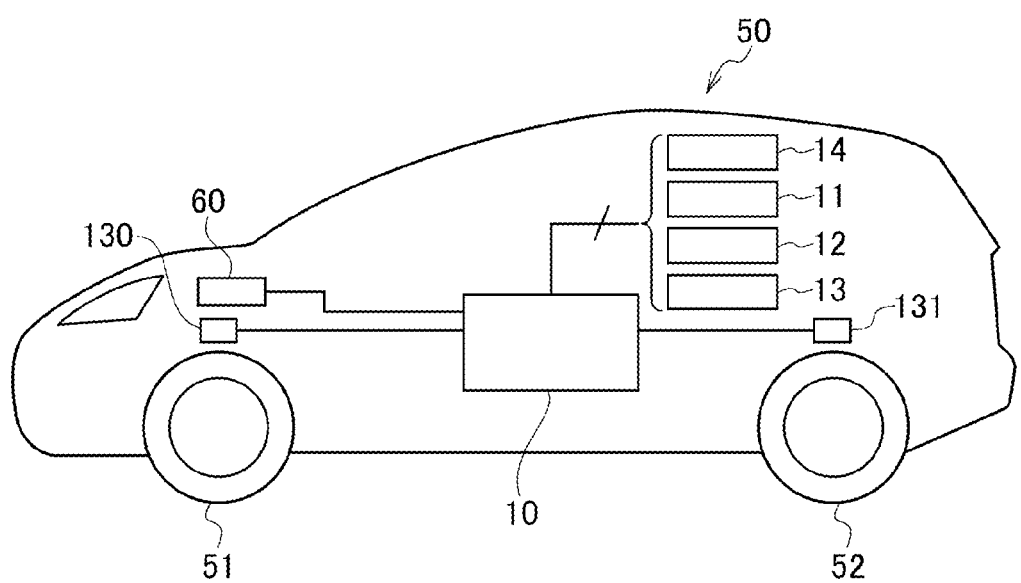
FIG. 2 is a side view showing an external appearance of a vehicle on which the control device according to the embodiment and the various peripheral devices connected to the control device are mounted.

A control device according to the present embodiment will be described with reference to the drawings. FIG. 1 is a block diagram showing a schematic configuration of a control device 10 according to the present embodiment and various peripheral devices connected to the control device (ECU) 10. FIG. 2 is a side view showing an external appearance of a vehicle 50 on which the control device 10 according to the present embodiment and the various peripheral devices connected to the control device 10 are mounted. In FIGS. 1 and 2, the vehicle 50 includes a third wheel and a fourth wheel (not shown) in addition to a first wheel 51 and a second wheel 52. The vehicle 50 is movable by rotation of each of the first wheel 51, the second wheel 52, the third wheel, and the fourth wheel. The vehicle 50 is not limited to a four-wheel vehicle, and may be a single-wheel vehicle or a two-wheel vehicle or more.

The vehicle 50 includes a battery 60, four control devices 10 to 13, a central gateway 14, and four solenoid loads 130 to 133 (the solenoid loads 132 and 133 are not shown in FIG. 2). The four control devices 10 to 13 have functions different from each other. Similarly to the control device 100 in the related art (see FIG. 7), the control device 10 controls a damping force of the solenoid damper (not shown) based on road surface information of each wheel and currents flowing through the solenoid loads 130 to 133 provided for each wheel.

In FIG. 1, the control device 10 includes a first circuit 61, a second circuit 62, a housing 63 that stores the first circuit 61 and the second circuit 62, a first power supply line (first power supply cord) 612 that connects at least a positive electrode and a negative electrode of the battery 60 to a first power supply portion BAT1 and a first ground portion GND1 of the first circuit 61, and a second power supply line (second power supply cord) 615 that connects at least the positive electrode and the negative electrode of the battery 60 to a second power supply portion BAT2 and a second ground portion GND2 of the second circuit 62.

The first circuit 61 is a circuit of a controller system, and the second circuit 62 is a circuit of a power system. Since the second circuit 62 is the circuit of the power system, a second consumption current of the second circuit 62 may be larger than a first consumption current of the first circuit 61 which is the circuit of the controller system.

Figure 3:
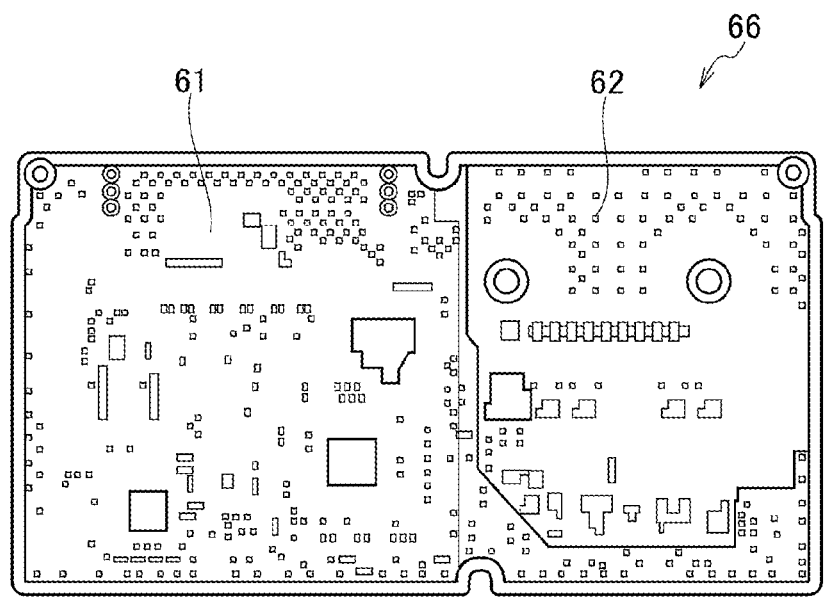
FIG. 3 is a diagram showing an example of a circuit board of the control device according to the embodiment.

The first circuit 61 and the second circuit 62 are disposed on one circuit board. The circuit board is stored in the housing 63. FIG. 3 is a diagram showing an example of a circuit board. In the figure, the first circuit 61 and the second circuit 62 are disposed on a circuit board 66. It should be noted that the circuit board may be formed of one sheet or may be formed of two or more sheets.

Figure 4:
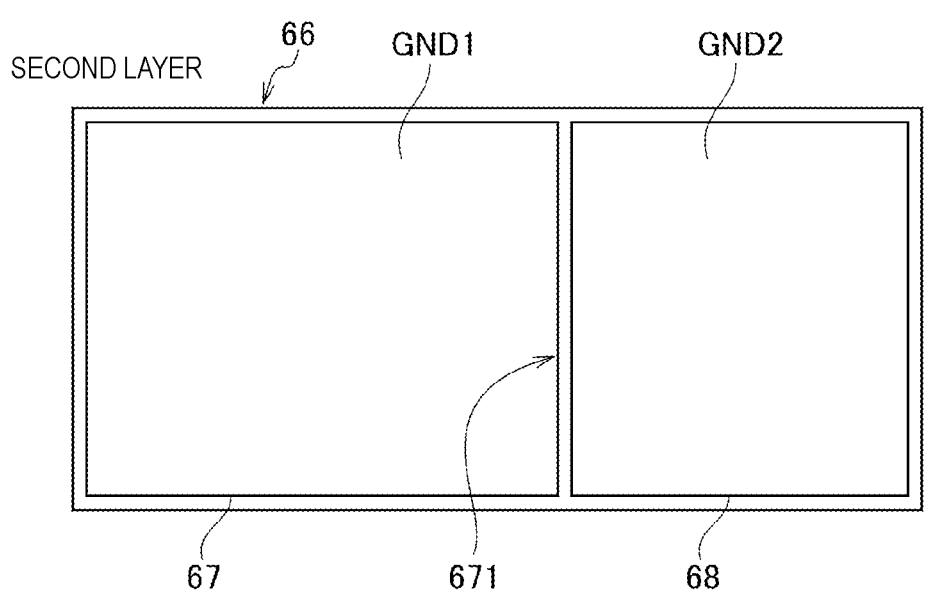
FIG. 4 is a diagram showing an example in which the circuit board of the control device according to the embodiment includes two or more boards.

FIG. 4 is a diagram showing the circuit board 66 formed of two or more layers of boards, in which the first ground portion GND1 of the first circuit 61 and the second ground portion GND2 of the second circuit 62 are disposed on the second layer. In this case, the first ground portion GND1 of the first circuit 61 includes a first planar conductive member 67 on the circuit board 66, and the second ground portion GND2 of the second circuit 62 includes a second planar conductive member 68 on the circuit board 66. The first planar conductive member 67 and the second planar conductive member 68 are disposed on the same surface of the circuit board 66, and at least a part 671 of the first planar conductive member 67 is disposed apart from the second planar conductive member 68.

Returning to FIG. 1, the housing 63 includes a first connector portion 64 that electrically connects the first power supply line 612 and the first circuit 61, and a second connector portion 65 that electrically connects the second power supply line 615 and the second circuit 62. In addition to the first power supply line 612, the first connector portion 64 electrically connects the first circuit 61 and a signal line 620 connected to the central gateway 14 and the control devices 11 to 13. In addition to the second power supply line 615, the first connector portion 65 electrically connects the second circuit 62 and a signal line 621 connected to the solenoid loads 130 to 133. The first connector portion 64 and the second connector portion 65 are separated from each other in the present embodiment, and they may be integrated.

The first power supply line 612 includes an electric wire 612G that electrically connects the negative electrode of the battery 60 and the first ground portion GND1 of the first circuit 61, but the electric wire 612G may break. In addition to a damping force control function of controlling the damping force of the solenoid damper, the control device 10 according to the present embodiment has a GND disconnection detection function of detecting breakage of the electric wire 612G connected to the first ground portion GND1 of the first circuit 61. The breakage of the electric wire 612G includes not only the breakage of the electric wire 612G itself but also the disconnection of a connection portion with the battery 60 and the connection portion with the first connector portion 64. The details of the GND disconnection detection function will be described later.

Figure 5:
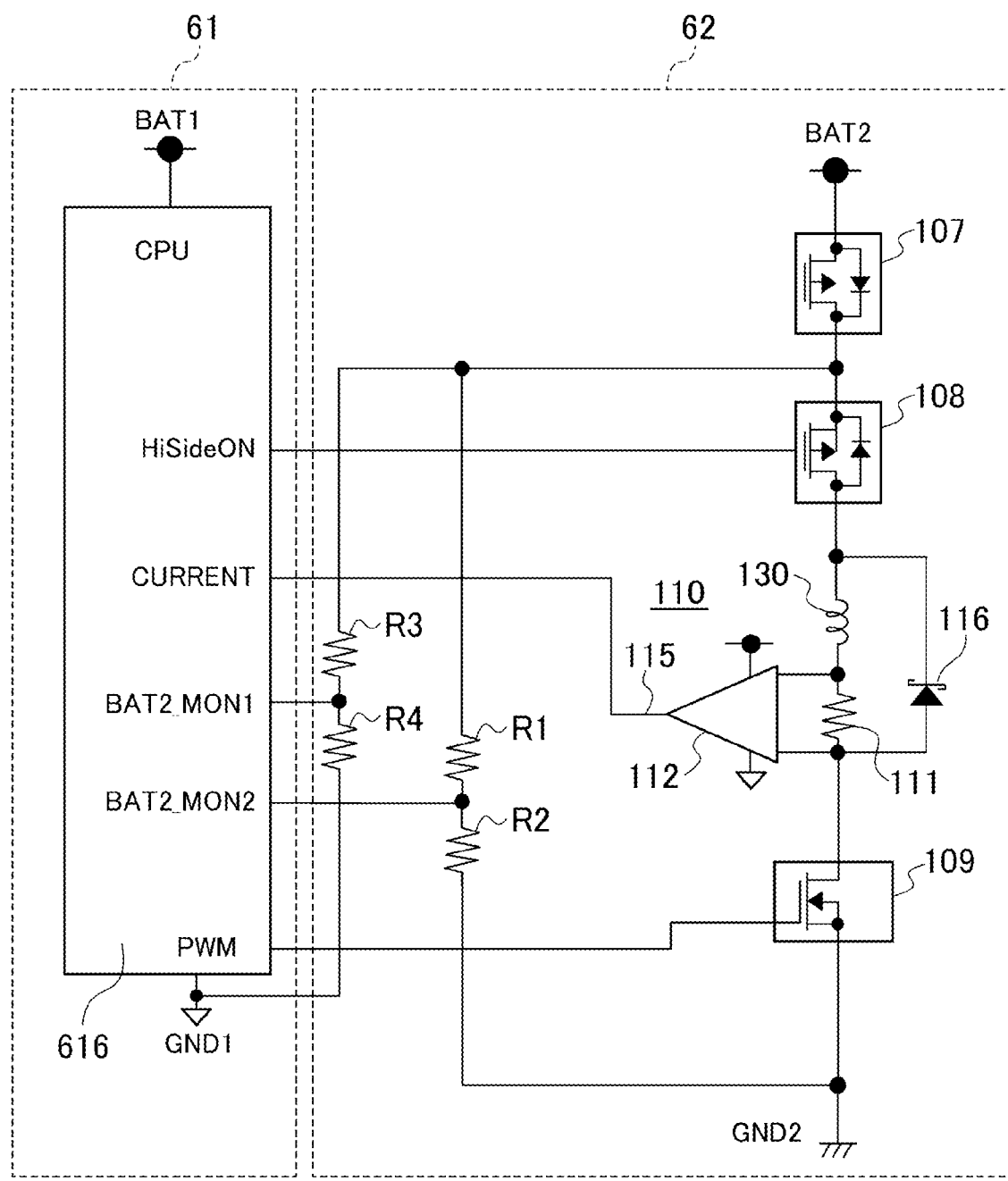
FIG. 5 is a circuit diagram showing a schematic configuration of a first circuit and a second circuit of the control device according to the embodiment.

FIG. 5 is a circuit diagram showing a schematic configuration of the first circuit 61 and the second circuit 62. In FIG. 5, a CPU 616 (control circuit) of the first circuit 61 includes a high-side ON terminal (HiSideON terminal), a current terminal (CURRENT terminal), a BAT2_MON1 terminal, a BAT2_MON2 terminal, and a PWM terminal. The second circuit 62 includes a backflow prevention circuit 107, a high side switch (current suppressing device) 108, a low side switch 109, a load current detection circuit 110, a solenoid load 130, and a Schottky barrier diode 116. The backflow prevention circuit 107 is interposed between the second power supply portion BAT2 and the high side switch 108, and prevents backflow of a current in the second circuit 62. The high side switch 108 includes a metal oxide semiconductor field effect transistor (MOSFET), and is interposed between the backflow prevention circuit 107 and the solenoid load 130. An ON/OFF control terminal of the high side switch 108 is connected to the high side ON terminal of the CPU 616 of the first circuit 61. The high side switch 108 suppresses a current flowing through the second circuit 62.

Two resistors R1 and R2 are interposed in series between the source of the high side switch 108 and the second ground portion GND2, and a connection portion of the resistors R1 and R2 is connected to the BAT2_MON2 terminal of the CPU 616 of the first circuit 61. In addition, two resistors R3 and R4 are interposed in series between the source of the high side switch 108 and the first ground portion GND1, and a connection portion of the resistors R3 and R4 is connected to the BAT2_MON1 terminal of the CPU 616 of the first circuit 61. Instead of using the high side switch 108 as the current suppressing unit, for example, a switch such as a mechanical relay may be used.

The low side switch 109 includes an N-channel MOSFET, and is inserted between the load current detection circuit 110 and the second ground portion GND2. A gate of the N-channel MOSFET of the low side switch 109 is connected to the PWM terminal of the CPU 616 of the first circuit 61.

The load current detection circuit 110 is interposed between the solenoid load 130 and the low side switch 109. The load current detection circuit 110 observes a current flowing through the solenoid load 130 and notifies the CPU 616 of the first circuit 61 of an observed current value. The load current detection circuit 110 includes a resistor 111 interposed in series with the solenoid load 130, and an OP amplifier (operational amplifier) 112 that amplifies a voltage generated in the resistor 111. An output terminal of the OP amplifier 112 and a current input (CURRENT) terminal of the CPU 616 of the first circuit 61 are connected by a signal line 115.

In the first circuit 61, the CPU 616 suppresses a current with the high side switch 108 based on the value of a current flowing through the second circuit 62. The CPU 616 performs PWM control on the low side switch 109. Further, the CPU 616 measures voltages applied to the BAT2_MON1 terminal and the BAT2_MON2 terminal, and determines whether or not these voltages have a predetermined relationship. That is, the CPU 616 measures a voltage of the second power supply portion BAT2 of the second circuit 62 as a first voltage with reference to a potential of the first ground portion GND1, and measures a voltage of the second power supply portion BAT2 of the second circuit 62 as a second voltage with reference to a potential of the second ground portion GND2. After measuring the first voltage and the second voltage, the CPU 616 determines whether or not the measured first voltage and second voltage have the predetermined relationship. When the CPU 616 determines that the first voltage and the second voltage have the predetermined relationship, the CPU 616 causes the high side switch 108 to set power supplied from the second power supply line 615 to the second circuit 62 to a predetermined value or less. For example, the power is set to be zero. A case where the measured first voltage and second voltage have a predetermined relationship is a case where the electric wire 612G breaks, a case where a connection portion with the battery 60 is disconnected, or a case where a connection portion with the first connector portion 64 is disconnected.

Here, the GND disconnection detection function will be described in detail.

Figure 6:
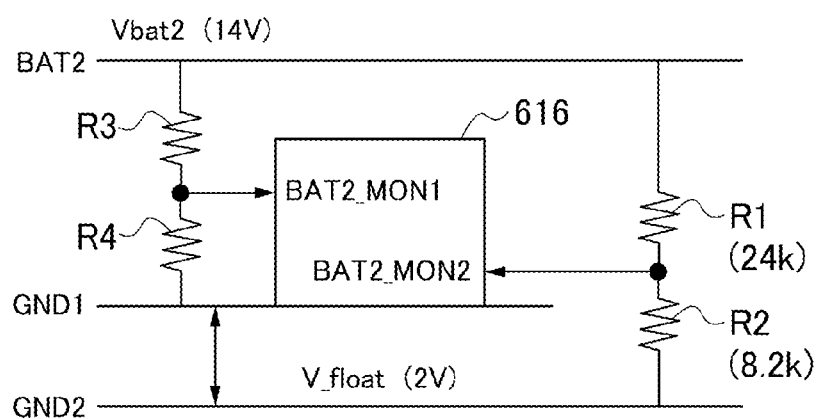
FIG. 6 is an equivalent circuit diagram of the first circuit and the second circuit of the control device according to the embodiment.

FIG. 6 is an equivalent circuit diagram of the first circuit 61 and the second circuit 62 shown in FIG. 5. The value of resistor R1 is 24 kΩ, and the value of resistor R2 is 8.2 kΩ. The disconnection in the first ground portion GND1 can be detected by turning on the high side switch 108 and comparing the first voltage and the second voltage.

BAT2_MON1 is a voltage with reference to the first ground portion GND1. When the electric wire 612G breaks, a path through which a current flows from the first circuit 61 to the second circuit 62 is formed, and the voltage of the first ground portion GND1 floats (rises) with respect to the voltage of the second ground portion GND2. A voltage obtained by subtracting a voltage of an amount that the first ground portion GND1 floats (V_float shown in the drawing)

from the BAT2 voltage is divided by the two resistors R3 and R4, and the divided voltage is input to the BAT2_MON1 terminal. When the voltage is calculated back to the voltage before being divided by the resistors R3 and R4 by software, the BAT2 voltage is calculated to a value lower by the amount that the first ground portion GND1 floats (V_float: 2 V shown in the drawing).

BAT2_MON2 is a voltage with reference to the second ground portion GND2. The BAT2 voltage is divided by the two resistors R1 and R2, and becomes a voltage obtained by subtracting a voltage of the amount that the first ground portion GND1 floats (V_float shown in the drawing). When the voltage is calculated back to the voltage before being divided by the resistors R1 and R2 by software, the BAT2 voltage appears to be a value obtained by subtracting a floating amount by 3.9 times.

A difference between the calculated values of BAT2_MON1 and BAT2_MON2 is 2.9 times the floating amount of the first ground portion GND1. That is, when V_float is, for example, 2 V, the difference is about 6 V, which is 2.9 times.

Therefore, if the difference between the calculated values of BAT2_MON1 and BAT2_MON2 is, for example, 1.5 V or more, or 3 V or more, it can be determined that the disconnection is occurred in the first ground portion GND1. That is, it can be determined that the electric wire 612G is breaks, the connection portion with the battery 60 is disconnected, or the connection portion with the first connector portion 64 is disconnected.

When the voltage (BAT2_MON1) of the second power supply portion BAT2 with the first ground portion GND1 as a reference and the voltage (BAT2_MON2) of the second power supply portion BAT2 with the second ground portion GND2 as a reference are read by the A/D conversion function of the CPU 616 and calculated back by a voltage division ratio, $$BAT2\_MON1 = (Vbat2 - V\_float) \quad (1)$$

$$BAT2\_MON2 = (Vbat2 \times R2/(R1+R2) - V\_float) \times (R1+R2)/R2 \quad (2)$$

$$= Vbat2 - (1 + R1/R2) \times V\_float$$

$$= (R1/R2) \times V\_float( = 2.9 \times V\_float) \quad (1)-(2)$$

In BAT2_MON1, the floating amount (V_float) is subtracted from Vbat2 and then the voltage is divided. In BAT2_MON2, the floating amount (V_float) is subtracted after the voltage division.

As described above, the control device 10 according to the present embodiment includes the first circuit 61 of the controller system including the CPU 616, the second circuit 62 of the power system including the high side switch 108 that suppresses a current flowing through the second circuit 62, the first power supply line 612 connecting the positive electrode and the negative electrode of the battery 60 to the first power supply portion BAT1 and the first ground portion GND1 of the first circuit 61, and the second power supply line 615 connecting the positive electrode and the negative electrode of the battery 60 to the second power supply portion BAT2 and the second ground portion GND2 of the second circuit 62. The CPU 616 measures a voltage of the second power supply portion BAT2 of the second circuit 62 as the first voltage with reference to the potential of the first ground portion GND1, and measures a voltage of the second power supply portion BAT2 of the second circuit 62 as the second voltage with reference to the potential of the second ground portion GND2. When the first voltage and the second voltage have a predetermined relationship, the power supplied from the second power supply line 615 to the second circuit 62 is set to be a predetermined value or less by the high side switch 108, so that deterioration of the solenoid load 130 and battery exhaustion can be prevented. That is, a failure caused by disconnection of the ground of the first circuit 61 of the controller system can be prevented.

A vehicle according to the present disclosure is a vehicle provided with at least a first wheel and a second wheel so as to be movable by rotating the first wheel and the second wheel, the vehicle including: a battery; a first circuit; a second circuit; a housing in which the first circuit and the second circuit are stored; a first power supply cord connecting at least a positive electrode and a negative electrode of the battery to a first power supply portion and a first ground portion of the first circuit, respectively; and a second power supply cord connecting at least the positive electrode and the negative electrode of the battery to a second power supply portion and a second ground portion of the second circuit, respectively. A second consumption current of the second circuit is possible to be larger than a first consumption current of the first circuit. The first circuit includes a control circuit. The control circuit is configured to measure a voltage of the second power supply portion of the second circuit as a first voltage with reference to a potential of the first ground portion. The control circuit is configured to measure a voltage of the second power supply portion of the second circuit as a second voltage with reference to a potential of the second ground portion. In a case in which the first voltage and the second voltage have a predetermined relationship, power supplied from the second power supply cord to the second circuit is set to be a predetermined value or less.

According to the present disclosure, the voltage of the second power supply portion of the second circuit of the power system is measured as the first voltage with reference to the potential of the first ground portion of the first circuit of the controller system, the voltage of the second power supply portion of the second circuit of the power system is measured as the second voltage with reference to the potential of the second ground portion of the second circuit of the power system, and power supplied from the second power supply cord to the second circuit is set to be a predetermined value or less in a case in which the measured first voltage and second voltage have a predetermined relationship. Therefore, high current does not continue to flow to the solenoid load, and deterioration of the solenoid load and battery exhaustion can be prevented. That is, a failure caused by disconnection of the ground of the circuit of the controller system can be prevented.

In the vehicle according to the present disclosure with the above configuration, an electric wire of the first power supply cord electrically connecting the negative electrode and the first ground portion is possible to break.

According to the present disclosure, the predetermined relationship is defined as a relationship between the first voltage and the second voltage in a case in which of at least two electric wires constituting the first power supply cord, the electric wire electrically connecting the negative electrode of the battery and the first ground portion of the first circuit breaks. Consequently, in a case in which the electric wire breaks and the first voltage and the second voltage have the predetermined relationship, a high current does not flow to the solenoid load. That is, even if the electric wire electrically connecting the negative electrode of the battery and the first ground portion of the first circuit breaks, a high current does not continue to flow to the solenoid load, so that the deterioration of the solenoid load and the battery exhaustion can be prevented.

In the vehicle according to the present disclosure with the above configuration, a signal line is provided to extend from the second circuit to the first circuit, the signal line through which an electric signal for observing a current flowing through the second circuit and notifying the control circuit of an observed current value flows.

According to the present disclosure, the control circuit of the first circuit can obtain the current flowing through the second circuit, that is, the current flowing through the solenoid load.

In the vehicle according to the present disclosure with the above configuration, the second circuit includes a current suppressing device, and the control circuit is configured to cause, based on the observed current value, the current suppressing device to suppress the current flowing through the second circuit.

According to the present disclosure, even if the electric wire electrically connecting the negative electrode of the battery and the first ground portion of the first circuit breaks, a high current does not continue to flow to the solenoid load, so that the deterioration of the solenoid load and the battery exhaustion can be prevented.

In the vehicle according to the present disclosure with the above configuration, the second circuit includes a current suppressing device, and in the case in which the first voltage and the second voltage have the predetermined relationship, the control circuit is configured to cause the current suppressing device to suppress the current flowing through the second circuit such that the power supplied from the second power supply cord to the second circuit is set to be the predetermined value or less.

According to the present disclosure, in the case in which the first voltage and the second voltage have the predetermined relationship, the power supplied to the second circuit is set to be the predetermined value or less. Therefore, high current does not continue to flow to the solenoid load, and deterioration of the solenoid load and battery exhaustion can be prevented.

In the vehicle according to the present disclosure with the above configuration, the housing stores a circuit board, and the first circuit and the second circuit are disposed on the circuit board.

According to the present disclosure, the first circuit and the second circuit are disposed on the circuit board stored in the housing, and in the case in which the first voltage of the second power supply portion of the second circuit of the power system and the second voltage of the second ground portion of the second circuit of the power system have the predetermined relationship, the power supplied to the second circuit is set to be the predetermined value or less. Therefore, high current does not continue to flow to the solenoid load, and deterioration of the solenoid load and battery exhaustion can be prevented.

In the vehicle according to the present disclosure with the above configuration, the first ground portion of the first circuit includes a first planar conductive member on the circuit board, the second ground portion of the second circuit includes a second planar conductive member on the circuit board, and at least a part of the first planar conductive member is disposed apart from the second planar conductive member on the circuit board.

According to the present disclosure, even if the first ground portion of the first circuit including the first planar conductive member is in a non-conductive state with the negative electrode of the battery, a high current does not continue to flow to the solenoid load, so that the deterioration of the solenoid load and the battery exhaustion can be prevented.

In the vehicle according to the present disclosure with the above configuration, the first planar conductive member and the second planar conductive member are disposed on a same surface of the circuit board.

According to the present disclosure, even if the first ground portion of the first circuit including the first planar conductive member is in a non-conductive state with the negative electrode of the battery, a high current does not continue to flow to the solenoid load, so that the deterioration of the solenoid load and the battery exhaustion can be prevented.

In the vehicle according to the present disclosure with the above configuration, the housing includes: a first connector that electrically connects the first power supply cord and the first circuit; and a second connector that electrically connects the second power supply cord and the second circuit.

According to the present disclosure, in the first connector that electrically connects the first power supply cord and the first circuit, even if a portion that connects the negative electrode of the battery and the first ground portion of the first circuit is disconnected, a high current does not continue to flow to the solenoid load, so that the deterioration of the solenoid load and the battery exhaustion can be prevented.

In the vehicle according to the present disclosure with the above configuration, the first connector and the second connector are separated from each other.

According to the present disclosure, in the first connector separated from the second connector, even if a portion that connects the negative electrode of the battery and the first ground portion of the first circuit is disconnected, a high current does not continue to flow to the solenoid load, so that the deterioration of the solenoid load and the battery exhaustion can be prevented.

A control device according to the present disclosure is a control device mountable on a vehicle, the vehicle being provided with at least a first wheel and a second wheel so as to be movable by rotating the first wheel and the second wheel, the vehicle including a battery, a first power supply cord connected to a positive electrode and a negative electrode of the battery, and a second power supply cord connected to the positive electrode and the negative electrode of the battery. The control device includes: a first circuit; a second circuit; and a housing in which the first circuit and the second circuit are stored. The first power supply cord is set to connect at least the positive electrode and the negative electrode of the battery to a first power supply portion and a first ground portion of the first circuit, respectively. The second power supply cord is set to connect at least the positive electrode and the negative electrode of the battery to a second power supply portion and a second ground portion of the second circuit, respectively. A second consumption current of the second circuit is possible to be larger than a first consumption current of the first circuit. The first circuit includes a control circuit. The control circuit is configured to measure a voltage of the second power supply portion of the second circuit as a first voltage with reference to a potential of the first ground portion. The control circuit is configured to measure a voltage of the second power supply portion of the second circuit as a second voltage with reference to a potential of the second ground portion. In a case in which the first voltage and the second voltage have a predetermined relationship, power supplied from the second power supply cord to the second circuit is set to be a predetermined value or less.

According to the present disclosure, the voltage of the second power supply portion of the second circuit of the power system is measured as the first voltage with reference to the potential of the first ground portion of the first circuit of the controller system, the voltage of the second power supply portion of the second circuit of the power system is measured as the second voltage with reference to the potential of the second ground portion of the second circuit of the power system, and power supplied from the second power supply cord to the second circuit is set to be a predetermined value or less in the case in which the measured first voltage and second voltage have a predetermined relationship. Therefore, high current does not continue to flow to the solenoid load, and deterioration of the solenoid load and battery exhaustion can be prevented. That is, a failure caused by disconnection of the ground of the circuit of the controller system can be prevented.

In the control device according to the present disclosure with the above configuration, an electric wire of the first power supply cord electrically connecting the negative electrode and the first ground portion is possible to break.

According to the present disclosure, the predetermined relationship is defined as a relationship between the first voltage and the second voltage in a case in which of at least two electric wires constituting the first power supply cord, the electric wire electrically connecting the negative electrode of the battery and the first ground portion of the first circuit breaks. Consequently, in a case in which the electric wire breaks and the first voltage and the second voltage have the predetermined relationship, a high current does not flow to the solenoid load. As described above, even if the electric wire electrically connecting the negative electrode of the battery and the first ground portion of the first circuit breaks, a high current does not continue to flow to the solenoid load, so that the deterioration of the solenoid load and the battery exhaustion can be prevented.

In the control device according to the present disclosure with the above configuration, a signal line is provided to extend from the second circuit to the first circuit, the signal line through which an electric signal for observing a current flowing through the second circuit and notifying the control circuit of an observed current value flows.

According to the present disclosure, the control circuit of the first circuit can obtain the current flowing through the second circuit, that is, the current flowing through the solenoid load.

In the control device according to the present disclosure with the above configuration, the second circuit includes a current suppressing device, and the control circuit is configured to cause, based on the observed current value, the current suppressing device to suppress the current flowing through the second circuit.

According to the present disclosure, even if the electric wire electrically connecting the negative electrode of the battery and the first ground portion of the first circuit breaks, a high current does not continue to flow to the solenoid load, so that the deterioration of the solenoid load and the battery exhaustion can be prevented.

In the control device according to the present disclosure with the above configuration, the second circuit includes a current suppressing device, and in the case in which the first voltage and the second voltage have the predetermined relationship, the control circuit is configured to cause the current suppressing device to suppress the current flowing through the second circuit such that the power supplied from the second power supply cord to the second circuit is set to be the predetermined value or less.

According to the present disclosure, in the case in which the first voltage and the second voltage have the predetermined relationship, the power supplied to the second circuit is set to be the predetermined value or less. Therefore, high current does not continue to flow to the solenoid load, and deterioration of the solenoid load and battery exhaustion can be prevented.

In the control device according to the present disclosure with the above configuration, the housing stores a circuit board, and the first circuit and the second circuit are disposed on the circuit board.

According to the present disclosure, the first circuit and the second circuit are disposed on the circuit board stored in the housing, and in the case in which the first voltage of the second power supply portion of the second circuit of the power system and the second voltage of the second ground portion of the second circuit of the power system have the predetermined relationship, the power supplied to the second circuit is set to be the predetermined value or less. Therefore, high current does not continue to flow to the solenoid load, and deterioration of the solenoid load and battery exhaustion can be prevented.

In the control device according to the present disclosure with the above configuration, the first ground portion of the first circuit includes a first planar conductive member on the circuit board, the second ground portion of the second circuit includes a second planar conductive member on the circuit board, and at least a part of the first planar conductive member is disposed apart from the second planar conductive member on the circuit board.

According to the present disclosure, even if the first ground portion of the first circuit including the first planar conductive member is in a non-conductive state with the negative electrode of the battery, a high current does not continue to flow to the solenoid load, so that the deterioration of the solenoid load and the battery exhaustion can be prevented.

In the control device according to the present disclosure with the above configuration, the first planar conductive member and the second planar conductive member are disposed on a same surface of the circuit board.

According to the present disclosure, even if the first ground portion of the first circuit including the first planar conductive member is in a non-conductive state with the negative electrode of the battery, a high current does not continue to flow to the solenoid load, so that the deterioration of the solenoid load and the battery exhaustion can be prevented.

In the control device according to the present disclosure with the above configuration, the housing includes: a first connector that electrically connects the first power supply cord; and the first circuit, and a second connector that electrically connects the second power supply cord and the second circuit.

According to the present disclosure, in the first connector that electrically connects the first power supply cord and the first circuit, even if a portion that connects the negative electrode of the battery and the first ground portion of the first circuit is disconnected, a high current does not continue to flow to the solenoid load, so that the deterioration of the solenoid load and the battery exhaustion can be prevented.

In the control device according to the present disclosure with the above configuration, the first connector and the second connector are separated from each other.

According to the present disclosure, in the first connector separated from the second connector, even if a portion that connects the negative electrode of the battery and the first ground portion of the first circuit is disconnected, a high current does not continue to flow to the solenoid load, so that the deterioration of the solenoid load and the battery exhaustion can be prevented.

According to the present disclosure, it is possible to prevent a failure caused by disconnection of a ground of a circuit of a controller system in a case where the ground is divided between the circuit of the controller system and a circuit of a power system.

The control device according to the present disclosure is useful for a vehicle such as a motorcycle or a four-wheel vehicle.

This application is based on and claims priority under 35 USC 119 from Japanese Patent Application No. 2021-150567 filed on Sep. 15, 2021, the contents of which are incorporated herein by reference.

What is claimed is:

1. A vehicle provided with at least a first wheel and a second wheel so as to be movable by rotating the first wheel and the second wheel, the vehicle comprising:
   a battery;
   a first circuit;
   a second circuit;
   a housing in which the first circuit and the second circuit are stored;
   a first power supply cord connecting at least a positive electrode and a negative electrode of the battery to a first power supply portion and a first ground portion of the first circuit, respectively; and
   a second power supply cord connecting at least the positive electrode and the negative electrode of the battery to a second power supply portion and a second ground portion of the second circuit, respectively,
   wherein a second consumption current of the second circuit is possible to be larger than a first consumption current of the first circuit,
   wherein the first circuit comprises a control circuit,
   wherein the control circuit is configured to measure a voltage of the second power supply portion of the second circuit as a first voltage with reference to a potential of the first ground portion,
   wherein the control circuit is configured to measure a voltage of the second power supply portion of the second circuit as a second voltage with reference to a potential of the second ground portion, and
   wherein in a case in which the first voltage and the second voltage have a predetermined relationship, power supplied from the second power supply cord to the second circuit is set to be a predetermined value or less.

2. The vehicle according to claim 1,
   wherein an electric wire of the first power supply cord electrically connecting the negative electrode and the first ground portion is possible to break.

3. The vehicle according to claim 1,
   wherein a signal line is provided to extend from the second circuit to the first circuit, the signal line through which an electric signal for observing a current flowing through the second circuit and notifying the control circuit of an observed current value flows.

4. The vehicle according to claim 3,
   wherein the second circuit comprises a current suppressing device, and
   wherein the control circuit is configured to cause, based on the observed current value, the current suppressing device to suppress the current flowing through the second circuit.

5. The vehicle according to claim 3,
   wherein the second circuit comprises a current suppressing device, and
   wherein in the case in which the first voltage and the second voltage have the predetermined relationship, the control circuit is configured to cause the current suppressing device to suppress the current flowing through the second circuit such that the power supplied from the second power supply cord to the second circuit is set to be the predetermined value or less.

6. The vehicle according to claim 1,
   wherein the housing stores a circuit board, and
   wherein the first circuit and the second circuit are disposed on the circuit board.

7. The vehicle according to claim 6,
   wherein the first ground portion of the first circuit comprises a first planar conductive member on the circuit board,
   wherein the second ground portion of the second circuit comprises a second planar conductive member on the circuit board, and
   wherein at least a part of the first planar conductive member is disposed apart from the second planar conductive member on the circuit board.

8. The vehicle according to claim 7,
   wherein the first planar conductive member and the second planar conductive member are disposed on a same surface of the circuit board.

9. The vehicle according to claim 1,
   wherein the housing comprises:
   a first connector that electrically connects the first power supply cord and the first circuit; and
   a second connector that electrically connects the second power supply cord and the second circuit.

10. The vehicle according to claim 9,
    wherein the first connector and the second connector are separated from each other.

11. A control device mountable on a vehicle, the vehicle being provided with at least a first wheel and a second wheel so as to be movable by rotating the first wheel and the second wheel, the vehicle comprising a battery, a first power supply cord connected to a positive electrode and a negative electrode of the battery, and a second power supply cord connected to the positive electrode and the negative electrode of the battery, the control device comprising:
    a first circuit;
    a second circuit; and
    a housing in which the first circuit and the second circuit are stored,
    wherein the first power supply cord is set to connect at least the positive electrode and the negative electrode of the battery to a first power supply portion and a first ground portion of the first circuit, respectively,
    wherein the second power supply cord is set to connect at least the positive electrode and the negative electrode of the battery to a second power supply portion and a second ground portion of the second circuit, respectively,
    wherein a second consumption current of the second circuit is possible to be larger than a first consumption current of the first circuit,
    wherein the first circuit comprises a control circuit, wherein the control circuit is configured to measure a voltage of the second power supply portion of the second circuit as a first voltage with reference to a potential of the first ground portion, wherein the control circuit is configured to measure a voltage of the second power supply portion of the second circuit as a second voltage with reference to a potential of the second ground portion, and wherein in a case in which the first voltage and the second voltage have a predetermined relationship, power supplied from the second power supply cord to the second circuit is set to be a predetermined value or less.

12. The control device according to claim 11,
wherein an electric wire of the first power supply cord electrically connecting the negative electrode of the first power supply cord and the first ground portion is possible to break.

13. The control device according to claim 11,
wherein a signal line is provided to extend from the second circuit to the first circuit, the signal line through which an electric signal for observing a current flowing through the second circuit and notifying the control circuit of an observed current value flows.

14. The control device according to claim 13,
wherein the second circuit comprises a current suppressing device, and
wherein the control circuit is configured to cause, based on the observed current value, the current suppressing device to suppress the current flowing through the second circuit.

15. The control device according to claim 13,
wherein the second circuit comprises a current suppressing device, and
wherein in the case in which the first voltage and the second voltage have the predetermined relationship, the control circuit is configured to cause the current suppressing device to suppress the current flowing through the second circuit such that the power supplied from the second power supply cord to the second circuit is set to be the predetermined value or less.

16. The control device according to claim 11,
wherein the housing stores a circuit board, and
wherein the first circuit and the second circuit are disposed on the circuit board.

17. The control device according to claim 16,
wherein the first ground portion of the first circuit comprises a first planar conductive member on the circuit board,
wherein the second ground portion of the second circuit comprises a second planar conductive member on the circuit board, and
wherein at least a part of the first planar conductive member is disposed apart from the second planar conductive member on the circuit board.

18. The control device according to claim 17,
wherein the first planar conductive member and the second planar conductive member are disposed on a same surface of the circuit board.

19. The control device according to claim 11,
wherein the housing comprises:
a first connector that electrically connects the first power supply cord and the first circuit; and
a second connector that electrically connects the second power supply cord and the second circuit.

20. The control device according to claim 19,
wherein the first connector and the second connector are separated from each other.

* * * * *